United States Patent
Kwak et al.

(10) Patent No.: US 9,698,174 B2
(45) Date of Patent: Jul. 4, 2017

(54) ARRAY SUBSTRATE, LIQUID CRYSTAL DISPLAY PANEL HAVING THE SAME AND METHOD OF MANUFACTURING THE SAME

(71) Applicant: Samsung Display Co., LTD., Yongin, Gyeonggi-Do (KR)

(72) Inventors: Chang-Hun Kwak, Suwon-si (KR); Chul Huh, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 211 days.

(21) Appl. No.: 14/327,765

(22) Filed: Jul. 10, 2014

(65) Prior Publication Data

US 2015/0198842 A1  Jul. 16, 2015

(30) Foreign Application Priority Data

Jan. 10, 2014  (KR) .......................... 10-2014-0003255

(51) Int. Cl.
G02F 1/1333 (2006.01)
H01L 27/12 (2006.01)
G02F 1/1335 (2006.01)
G02F 1/1362 (2006.01)

(52) U.S. Cl.
CPC .... *H01L 27/1262* (2013.01); *G02F 1/136209* (2013.01); *H01L 27/1248* (2013.01); *G02F 1/133516* (2013.01); *G02F 2001/133388* (2013.01); *G02F 2001/136222* (2013.01); *H01L 27/1225* (2013.01); *H01L 27/1288* (2013.01)

(58) Field of Classification Search
CPC ......... G02F 1/133514; G02F 1/133512; G02F 1/136209; G02F 2001/136222

USPC ................................................ 349/106, 110
See application file for complete search history.

(56) References Cited

U.S. PATENT DOCUMENTS

| | | | |
|---|---|---|---|
| 6,384,882 B1 | 5/2002 | Nagayama et al. | |
| 7,679,693 B2 | 3/2010 | Park | |
| 7,701,534 B2 | 4/2010 | Lee et al. | |
| 8,035,779 B2 | 10/2011 | Baek et al. | |
| 8,077,275 B2 | 12/2011 | Yang et al. | |

(Continued)

FOREIGN PATENT DOCUMENTS

| | | |
|---|---|---|
| JP | 2011-081177 A | 4/2011 |
| KR | 10-0643561 B | 11/2006 |
| KR | 1020070077998 A | 7/2007 |

*Primary Examiner* — Thanh-Nhan P Nguyen
(74) *Attorney, Agent, or Firm* — Cantor Colburn LLP

(57) ABSTRACT

An array substrate includes a base substrate including a display area and a peripheral area adjacent to the display area, a gate line extending in a first direction, a data line extending in a second direction crossing the gate line, a switching element electrically connected to the gate and data lines, a color filter pattern and a dummy color pattern in the display and peripheral areas, respectively, a pixel electrode on the color filter pattern, and a light blocking pattern including a black matrix pattern partially overlapping the color filter pattern and a black boundary pattern overlapping the dummy color pattern. The black boundary pattern covers the peripheral area and includes a first portion which overlaps the dummy color pattern and a second portion which does not overlap the dummy color pattern. A cross-sectional thickness of the first portion is smaller than that of the second portion.

19 Claims, 9 Drawing Sheets

(56) References Cited

U.S. PATENT DOCUMENTS

| | | |
|---|---|---|
| 8,085,366 B2 | 12/2011 | Chang |
| 8,139,182 B2 | 3/2012 | Takahashi et al. |
| 8,169,569 B2 * | 5/2012 | Kang ................. G02F 1/133345 349/106 |
| 2010/0065850 A1 * | 3/2010 | Kwak ............... G02F 1/136227 257/72 |
| 2010/0079710 A1 * | 4/2010 | Yang ................... G02F 1/13392 349/106 |
| 2015/0092138 A1 | 4/2015 | Kwak et al. |
| 2015/0103296 A1 | 4/2015 | Kwak et al. |

* cited by examiner

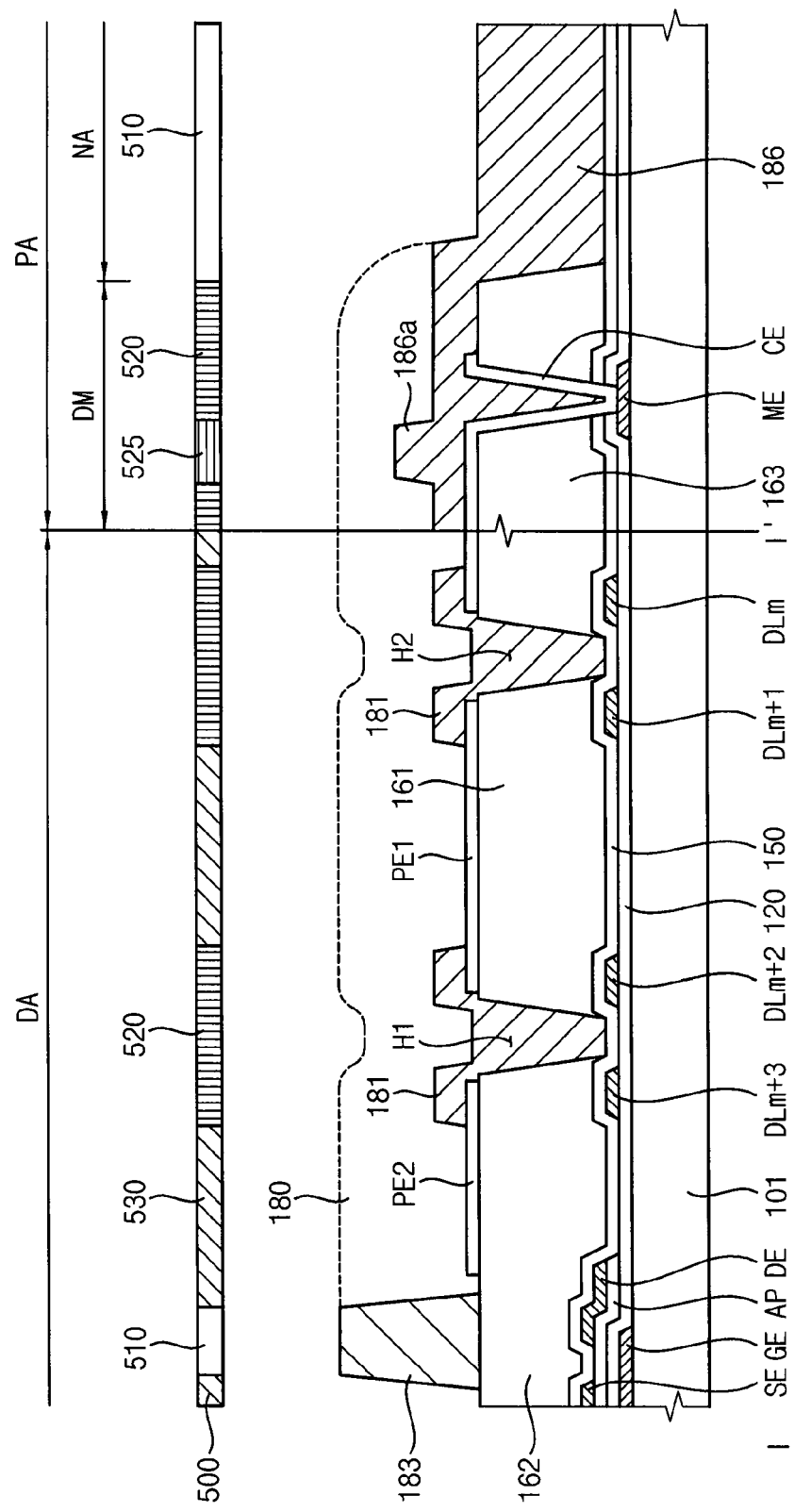

ARRAY SUBSTRATE, LIQUID CRYSTAL DISPLAY PANEL HAVING THE SAME AND METHOD OF MANUFACTURING THE SAME

This application claims priority to Korean Patent Application No. 10-2014-0003255, filed on Jan. 10, 2014, and all the benefits accruing therefrom under 35 U.S.C. §119, the contents of which in its entirety is herein incorporated by reference.

BACKGROUND

1. Field

Exemplary embodiments of the invention relate to an array substrate, a liquid crystal display panel having the same and a method of manufacturing the same. More particularly, exemplary embodiments of the invention relate to an array substrate, a liquid crystal display panel having the same and a method of manufacturing the same, each capable of improving manufacturing reliability of a liquid crystal display panel.

2. Description of the Related Art

A liquid crystal display panel may include an array substrate, an opposing substrate and a liquid crystal display layer between the array and opposing substrates. The array substrate may include a plurality of thin film transistors. The opposing substrate may face the array substrate.

The liquid crystal display panel may further include a color filter to transmit a desired color light. A color filter on array substrate ("COA") structure in which the array substrate includes the color filter may have higher light transmissivity than a structure in which the opposing substrate includes the color filter.

If the array substrate includes the color filter and the opposing substrate includes a light blocking pattern, a misalignment may occur between the color filter and the light blocking pattern when assembling the array substrate with the opposing substrate.

SUMMARY

A liquid crystal display panel may have a black matrix on array substrate ("BOA") structure in which the array substrate of a color filter on array substrate ("COA") structure further includes a light blocking pattern (e.g., black matrix) in order to reduce the misalignment between the color filter and the light blocking pattern. If the liquid crystal display panel includes the BOA structure, a portion of the array substrate may become relatively thick due to an overlapping of the color filter and the light blocking pattern, thereby reducing uniformity of a cell gap between the array substrate and an opposing substrate of the liquid crystal display apparatus.

One or more exemplary embodiment of the invention provides an array substrate capable of improving yield rate and reliability of a liquid crystal display panel including the array substrate.

Also, an exemplary embodiment of the invention provides a liquid crystal display panel having the array substrate.

Furthermore, an exemplary embodiment of the invention provides a method of manufacturing the array substrate.

In an exemplary embodiment of an array substrate according to the invention, the array substrate includes a base substrate including a display area and a peripheral area adjacent to the display area, a gate line extending in a first direction on the base substrate, a data line extending in a second direction crossing the gate line, a switching element electrically connected to the gate line and the data line, a color filter pattern and a dummy color pattern in the display area and the peripheral area, respectively, a pixel electrode on the color filter pattern, a black matrix pattern partially overlapping the color filter pattern and a black boundary pattern overlapping the dummy color pattern. The pixel electrode is electrically connected to the switching element. The black boundary pattern covers the peripheral area. The black boundary pattern includes a first portion which overlaps the dummy color pattern and a second portion which does not overlap the dummy color pattern. A cross-sectional thickness of the first portion of the black boundary pattern is smaller than that of the second portion of the black boundary pattern.

In an exemplary embodiment, the gate line, the data line, the switching element and the pixel electrode may be in the display area.

In an exemplary embodiment, the color filter pattern may include a first color filter transmitting a first color light and a second color filter transmitting a second color light which is different from the first color light. A groove may be defined between the first color filter and the second color filter.

In an exemplary embodiment, the black matrix pattern may be in the groove between the first color filter and the second color filter.

In an exemplary embodiment, the array substrate may further include a black column spacer on the color filter pattern.

In an exemplary embodiment, the black boundary pattern may include a protruding portion extended from the first portion. A height of the protruding portion may be smaller than that of the black column spacer, with respect to the base substrate.

In an exemplary embodiment, the black column spacer, the black matrix pattern and the black boundary pattern may include a same material as each other.

In an exemplary embodiment, a height of the first portion of the black boundary pattern may be larger than a height of the second portion of the black boundary pattern, with respect to the base substrate.

In an exemplary embodiment, the array substrate may further include a sealant on the second portion of the black boundary pattern.

In an exemplary embodiment, the array substrate may further include a metal pattern between the base substrate and the dummy color pattern in the peripheral area.

In an exemplary embodiment of a liquid crystal display panel according to the invention, the liquid crystal display panel includes an array substrate, an opposing substrate facing the array substrate and a liquid crystal layer disposed between the array substrate and the opposing substrate. The array substrate includes a base substrate including a display area and a peripheral area adjacent to the display area, a gate line extending in a first direction on the base substrate, a data line extending in a second direction crossing the gate line, a switching element electrically connected to the gate line and the data line, a color filter pattern and a dummy color pattern in the display area and the peripheral area, respectively, a pixel electrode on the color filter pattern, a black matrix pattern partially overlapping the color filter pattern and a black boundary pattern overlapping the dummy color pattern. The pixel electrode is electrically connected to the switching element. The black boundary pattern covers the peripheral area. The black boundary pattern includes a first portion which overlaps the dummy color pattern and a second portion which does not overlap the dummy color pattern. A cross-sectional thickness of the first portion of the black boundary pattern is smaller than that of the second portion of the black boundary pattern.

In an exemplary embodiment, the color filter pattern may include a first color filter transmitting a first color light and a second color filter transmitting a second color light different from the first color light. The black matrix pattern may be in a groove defined between the first color filter and the second color filter.

In an exemplary embodiment, the array substrate may further include a black column spacer on the color filter pattern.

In an exemplary embodiment, the black boundary pattern may include a protruding portion extending from the first portion of the black boundary pattern. A height of the protruding portion may be smaller than a height of the black column spacer, with respect to the base substrate.

In an exemplary embodiment, the black column spacer, the black matrix pattern and the black boundary pattern may include a same material as each other.

In an exemplary embodiment of a liquid crystal display panel according to the invention, a metal pattern and a passivation layer are formed on a base substrate. The passivation layer covers the metal pattern. A color filter pattern and a dummy color pattern are formed on the passivation layer. A pixel electrode is formed on the color filter pattern. A light blocking layer is formed on the base substrate including the pixel electrode thereon. The light blocking layer entirely covers the base substrate. The light blocking layer is patterned using a mask to form a black boundary pattern. The black boundary pattern covers the dummy color pattern. A cross-sectional thickness of the first portion of the black boundary pattern overlapping the dummy color pattern is smaller than that of a second portion of the black boundary pattern not overlapping the dummy color pattern.

In an exemplary embodiment, the mask may include a slit portion overlapping the first portion of the black boundary pattern and a transmitting portion overlapping the second portion of the black boundary pattern.

In an exemplary embodiment, the light blocking layer may be further patterned to form a black matrix pattern partially overlapping the color filter pattern. The black boundary pattern and the black matrix pattern may be simultaneously formed.

In an exemplary embodiment, the mask may include a first slit portion overlapping the first portion of the black boundary pattern and transmitting a first light amount, a second slit portion overlapping the first portion of the black boundary pattern and transmitting a second light amount greater than the first light amount and a light transmitting portion overlapping the second portion of the black boundary pattern. The light blocking layer may be further patterned to form a protruding portion extending from the first portion of the black boundary pattern.

In an exemplary embodiment, a sealant may be formed to partially overlap a second portion of the black boundary pattern.

According to one or more exemplary embodiment of the array substrate, the liquid crystal display panel having the same and the method of manufacturing the same, the first portion of the light blocking pattern overlapping the dummy color pattern in the peripheral area may be thinner than the second portion of the light blocking pattern in an outer area adjacent to the dummy color pattern, thereby forming the height of the light blocking pattern in the peripheral area to be lower than the height of the column spacer in the display area, and thereby maintaining a cell gap both in the display area and the peripheral area, to improve yield rate and manufacturing reliability of the liquid crystal panel.

BRIEF DESCRIPTION OF THE DRAWINGS

The above and other features and advantages of the invention will become more apparent by describing in detailed exemplary embodiments thereof with reference to the accompanying drawings, in which:

FIG. 4A to 4F are cross-sectional views illustrating an exemplary embodiment of a method of manufacturing the array substrate in FIG. 3.

DETAILED DESCRIPTION

Figure 1:
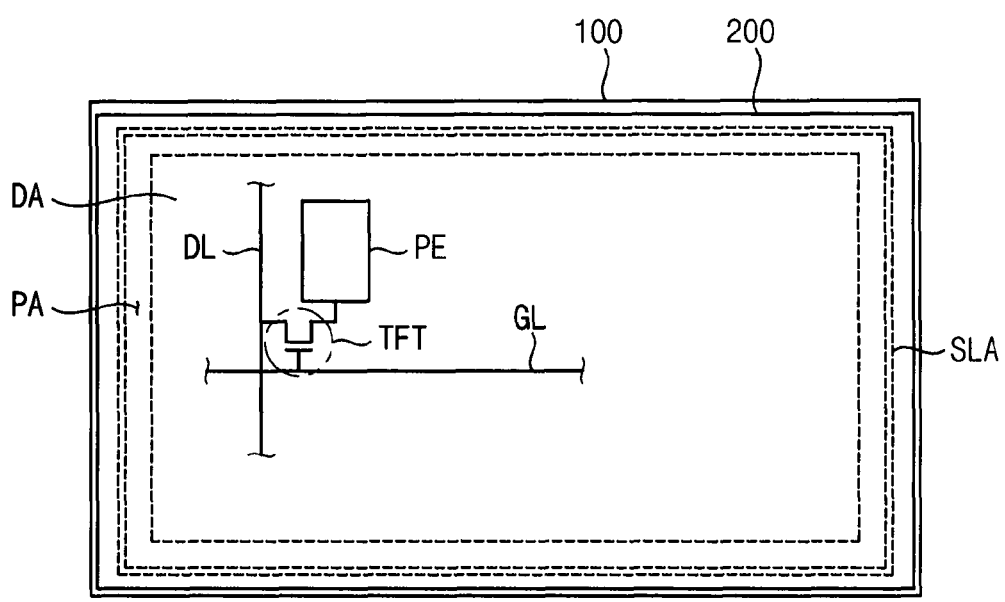
FIG. 1 is a plan view illustrating an exemplary embodiment of a liquid crystal display panel according to the invention.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on," "connected to" or "coupled to" another element or layer, the element or layer can be directly on, connected or coupled to another element or layer or intervening elements or layers. In contrast, when an element is referred to as being "directly on," "directly connected to" or "directly coupled to" another element or layer, there are no intervening elements or layers present. As used herein, connected may refer to elements being physically and/or electrically connected to each other. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, exemplary embodiments of the invention will be described in further detail with reference to the accompanying drawings.

FIG. 1 is a plan view illustrating an exemplary embodiment of a liquid crystal display panel according to the invention.

Referring to FIG. 1, a liquid crystal display panel may include an array substrate 100, an opposing substrate 200 facing the array substrate, and a liquid crystal display layer between the array and opposing substrates (not illustrated in FIG. 1).

The array substrate 100 may include a display area DA, and a peripheral area PA adjacent to the display area DA. The display area DA may be an area through which a light from a light source transmits to display an image. The peripheral area PA may be an area in which the light from the light source is blocked such that an image is not displayed.

A plurality of gate lines GL, a plurality of data lines DL crossing the gate lines GL, a plurality of pixel electrodes PE electrically connected to the gate lines GL and the data lines DL may be disposed in the display area DA. A plurality of switching elements TFT may electrically connect the pixel electrodes PE, to the gate lines GL and the data lines DL.

The peripheral area PA may include a data driving area, a gate driving area and a seal line area SLA. The peripheral area PA may further include a static electricity pattern area.

A plurality of output pads configured to output data voltages to the data lines DL may be disposed in the data driving area. The data driving area may be disposed at an end portion of the data lines DL in the peripheral area PA.

A gate driving circuit configured to apply gate signals to the gate lines GL may be disposed in the gate driving area. The gate driving area may be disposed at an end portion of the gate lines GL in the peripheral area PA.

A plurality of static electricity patterns may be disposed in the static electricity pattern area to reduce static electricity applied to the pixel electrodes PE which are disposed in the display area DA. In an exemplary embodiment, for example, the static electricity patterns may reduce the static electricity applied from an external element in a manufacturing process of the array substrate 100, thereby not damaging the switching elements TFT and substantially maintaining electrical features of the switching elements TFT. The static electricity patterns may be adjacent to a side of the display area DA, in the peripheral area PA.

A sealant configured to seal the liquid crystal layer between the array substrate 100 and the opposing substrate 200 may be disposed in the seal line area SLA.

Figure 2:
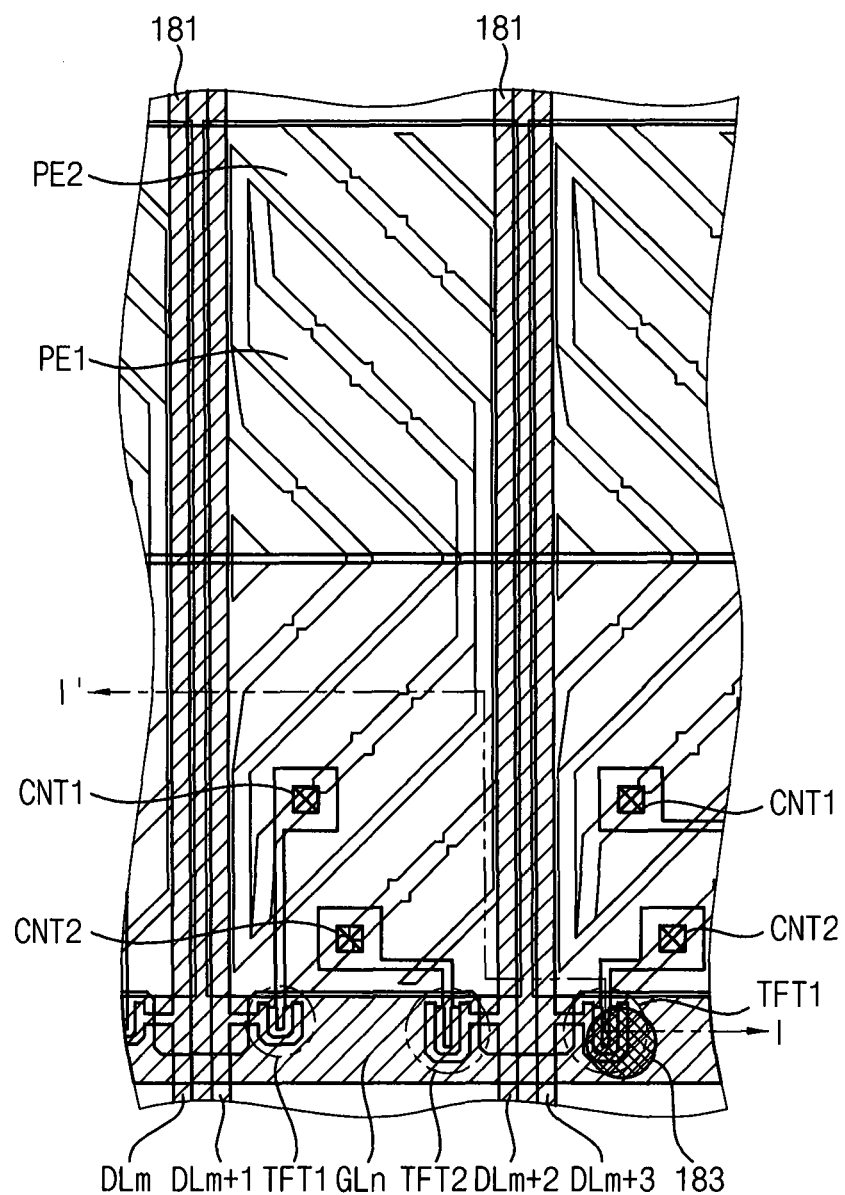
FIG. 2 is an enlarged plan view illustrating the liquid crystal display panel in FIG. 1.
Figure 3:
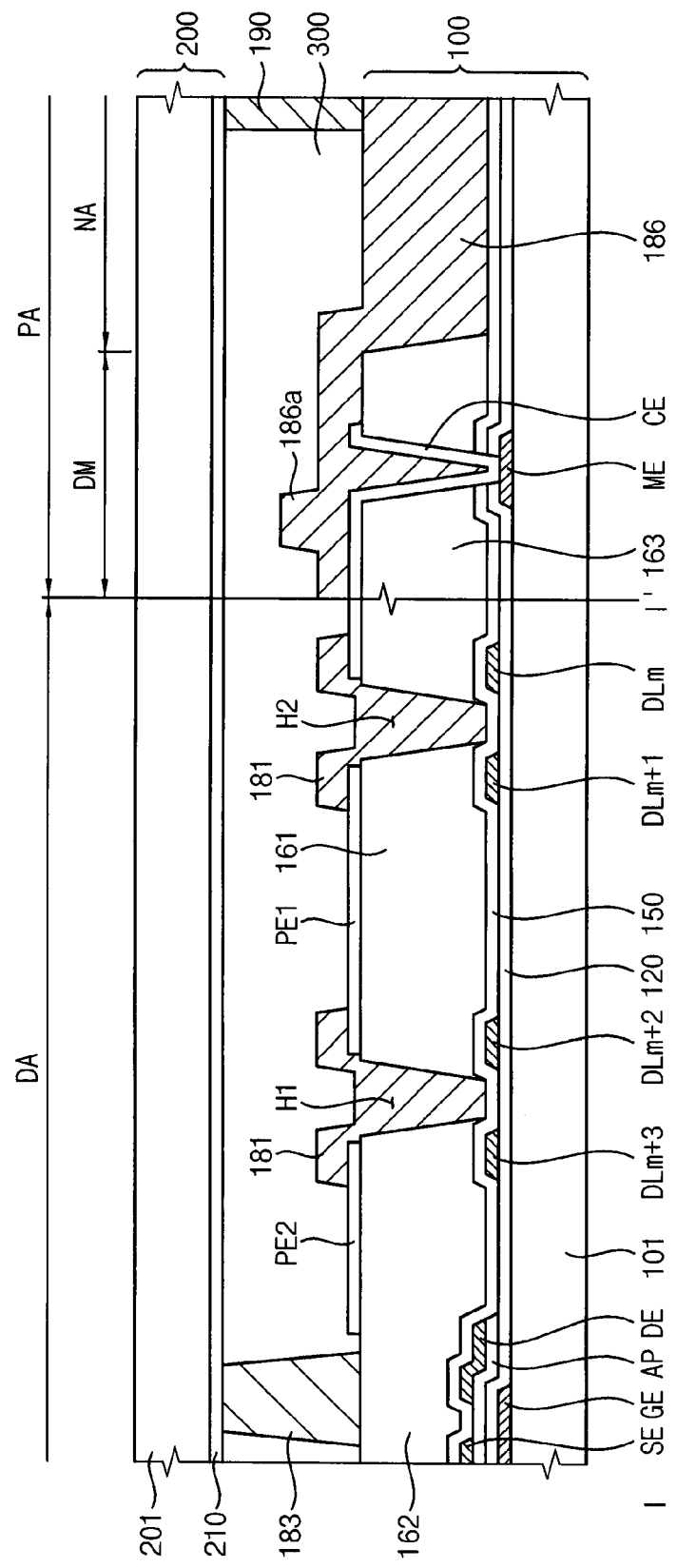
FIG. 3 is a cross-sectional view taken along line I-I' of FIG. 2.

FIG. 2 is an enlarged plan view illustrating the liquid crystal display panel in FIG. 1. FIG. 3 is a cross-sectional view taken along line I-I' of FIG. 2.

Referring to FIG. 1, FIG. 2 and FIG. 3, the liquid crystal display panel may include the array substrate 100, the opposing substrate 200 and a liquid crystal layer 300.

The array substrate 100 may include a first base substrate 101, a gate line GLn, a metal pattern ME, a gate insulation layer 120, switching elements TFT1 and TFT2, data lines DLm, DLm+1, DLm+2 and DLm+3, a passivation layer 150, color filter patterns 161 and 162, a dummy color pattern 163, pixel electrodes PE1 and PE2, light blocking patterns 181, 183, 186 and 186a and a sealant 190. The switching elements TFT1 and TFT2 may include a gate electrode GE, an active pattern AP, a source electrode SE and a drain electrode DE. The light blocking patterns 181, 183, 186 and 186a may include a black column spacer 183, a black matrix pattern 181, a black sub-column spacer 186a and a black boundary pattern 186.

The gate line GLn, the switching elements TFT1 and TFT2, the color filter patterns 161 and 162, the black column spacer 183 and the black matrix pattern 181 may be disposed in the display area DA of the liquid crystal display panel.

The metal pattern ME, the dummy color pattern 163, the black sub-column spacer 186a, the black boundary pattern 186 and the sealant 190 may be disposed in the peripheral area PA of the liquid crystal display panel.

The first base substrate 101 may include a transparent insulation material. In an exemplary embodiment, for example, the first base substrate 101 may include glass, quartz, plastic, a polyethylene terephthalate resin, a polyethylene resin, a polycarbonate resin, etc.

Hereinafter, elements disposed in the display area DA will be described, and then elements disposed in the peripheral area PA will be described.

The gate lines GL is disposed on the first base substrate 101. In an exemplary embodiment, for example, the gate lines GL may extend in a first direction on the first base substrate 101. In an exemplary embodiment, for example, the gate lines GL may include an n-th gate line GLn in the display area DA. The gate lines GL may include, for example, aluminum (Al), gold (Au), silver (Ag), copper (Cu), iron (Fe), nickel (Ni), etc. These may be used alone or in a combination thereof In an exemplary embodiment, for example, the gate lines GL may include indium doped zinc oxide ("IZO"), gallium doped zinc oxide ("GZO"), etc.

The gate electrode GE may be electrically connected to each of the gate lines GL. The gate electrode GE may include a same material as the gate lines GL. In an exemplary embodiment, for example, the gate electrodes GE may be integral with each of the gate lines GL, so as to form a single, unitary, indivisible gate member.

The gate insulation layer 120 may be disposed on the first base substrate including the gate electrode GE and the gate lines GL thereon. The gate insulation layer 120 may include a transparent insulation material such as, e.g., silicon oxide, silicon nitride, etc.

The active pattern AP may be disposed on the gate insulation layer 120. The active pattern may overlap the gate electrode GE. The active pattern AP may include, e.g., indium (In), zinc (Zn), gallium (Ga), tin (Sn), hafnium (Hf), etc. In an exemplary embodiment, for example, the active pattern AP may include an oxide semiconductor pattern such as, e.g., indium gallium zinc oxide ("IGZO"), indium tin zinc oxide ("ITZO"), hafnium indium zinc oxide ("ITZO"), etc.

The data lines DL may be disposed on the first base substrate 101 including the active pattern AP thereon. The data lines DL may extend in a second direction crossing the first direction. The data lines DL may be arranged in the first direction. In an exemplary embodiment, for example, the data lines DL may include m-th to m+3-th data lines DLm, DLm+1, DLm+2 and DLm+3 sequentially arranged along the first direction and in the display area DA. The data lines DL may include a same material as the gate lines GL.

The source electrode SE may be disposed on the gate insulation layer 120. The source electrode SE may overlap a first end portion of the active pattern AP. A source electrode SE may be electrically connected to each of the data lines DL. In an exemplary embodiment, for example, the source electrode SE may be integral with a respective one of the data lines DL so as to form a single, unitary, indivisible data member.

The drain electrode DE may be disposed on the gate insulation layer 120. The drain electrode DE may be spaced apart from the source electrode SE. The drain electrode DE may overlap a second end portion of the active pattern AP opposite to the first end portion. The drain electrode DE may include a same material as the source electrode SE.

The passivation layer 150 may be disposed on the source electrode SE and the drain electrode DE. The passivation layer 150 may cover the source electrode SE and the drain electrode DE. The passivation layer 150 may include an inorganic insulation material.

The color filter patterns 161 and 162 may be disposed on the passivation layer 150. The color filter patterns 161 and 162 may include a first color filter 161 transmitting a first color light and a second color filter 162 transmitting a second color light which is different from the first color light. The color filter patterns 161 and 162 may overlap a pixel area of the liquid crystal display panel. In an exemplary embodiment, the pixel area may be defined by the gate lines GL and the data lines DL in the display area DA, but the invention is not limited thereto. In an exemplary embodiment, for example, the first color filter 161 may overlap a first pixel area defined by the m+1-th data line DLm+1, the m+2-th data line DLm+2, the n-th gate line GLn and an n−1-th gate line (not illustrated). The second color filter 162 may overlap a second pixel area defined by the m+3-th data line DLm+3, an m+4-th data line (not illustrated), the n-the gate line GLn and the n−1-th gate line. A plurality of grooves H1 and H2 may be defined in and between adjacent color filter patterns 161 and 162.

The pixel electrodes PE1 and PE2 may contact the drain electrode DE through contact holes CNT1 and CNT2 defined in the color filter patterns 161 and 162. The pixel electrode PE1 and PE2 may include a first pixel electrode PE1 and a second pixel electrode PE2 dividing one pixel area into a plurality of domains. A plurality of slits may be defined in each of the pixel electrodes PE1 and PE2 to align liquid crystal molecules in the liquid crystal layer 300. The pixel electrodes PE1 and PE2 may include a transparent conductive material.

The black matrix pattern 181 may be disposed in the grooves H1 and H2 which are between the color filter patterns 161 and 162. The black matrix pattern 181 may partially overlap an edge portion of the color filter patterns 161 and 162 in the plan view. The black matrix pattern 181 may overlap the data lines DL in the plan view. The black matrix pattern 181 may further overlap the gate lines GL in the plan view.

The black column spacer 183 may be disposed on the color filter pattern 162. The black column spacer 183 may maintain a cell gap between the array substrate 100 and the opposing substrate 200. The black column spacer 183 may partially overlap at least one of the gate lines GL, the switching elements TFT and the data lines DL.

A height of the black column spacer 183 may be greater than a height of the black matrix pattern 181, with respect to the first base substrate 101. The black column spacer 183 may include a same material as the black matrix pattern 181. In an exemplary embodiment of manufacturing the liquid crystal display panel, for example, the black column spacer 183 may be simultaneously formed with the black matrix pattern 181 on the first base substrate 101 including the pixel electrodes PE1 and PE2 thereon.

In an exemplary embodiment of manufacturing the liquid crystal display panel, the metal pattern ME may be simultaneously formed with the gate lines GL on the first base substrate 101 in the peripheral area PA, and may be in a same layer of the array substrate 100. The metal pattern ME may include a same material as the gate lines GL. The metal pattern ME may be disposed in the static electricity area or the gate driving area of the peripheral area PA.

The dummy color pattern 163 may be disposed on the passivation layer 150. The dummy color pattern 163 may overlap the metal pattern ME. The dummy color pattern 163 may include a same material as the color filter patterns 161 and 162. In an exemplary embodiment of manufacturing the liquid crystal display panel, for example, the dummy color pattern 163 may be simultaneously formed with one of the first color filter 161 and the second color filter 162, and be in a same layer of the array substrate 100 as the color filter patterns 161 and 162.

A contact electrode CE may be disposed on the dummy color pattern 163. The contact electrode CE may contact the metal pattern ME through a desired contact hole defined in the dummy color pattern 163.

The black boundary pattern 186 may be disposed on the dummy color pattern 163 in the peripheral area PA. The black boundary pattern 186 may be disposed both in a dummy area DM of the peripheral area PA in which the dummy color pattern 163 is disposed and in an outer area NA of the peripheral area PA adjacent to the dummy area DM. The black boundary pattern 186 may cover the dummy area DM and the outer area NA. The black boundary pattern 186 may overlap the dummy color pattern 163, the contact electrode CE and the metal pattern ME. The black boundary pattern 186 may include a same material as the black matrix pattern 181. In an exemplary embodiment of manufacturing the liquid crystal display panel, for example, the black boundary pattern 186 may be simultaneously formed with the black matrix pattern 181, and may be in same layer of the array substrate 100 as the black matrix pattern 181.

A portion of the black boundary pattern 186 in the outer area NA may have a larger cross-sectional thickness than a portion of the black boundary pattern 186 in the dummy area DM. A height of the black boundary pattern 186 in the dummy area may be higher than a height of the black boundary pattern 186 in the outer area NA, with respect to the first base substrate 101.

The black sub-column spacer 186a may be a protruding portion of the black boundary pattern 186. In an exemplary embodiment, for example, the black sub-column spacer 186a may partially protrude from the black boundary pattern 186 in the dummy area DM.

In the illustrated exemplary embodiment, the black column spacer 183, the black matrix pattern 181, the black sub-column spacer 186a and the black boundary pattern 186 may include a same material as each other, and be in a same layer as each other. In an exemplary embodiment of manufacturing the liquid crystal display panel, for example, the black column spacer 183, the black matrix pattern 181, the black sub-column spacer 186a and the black boundary pattern 186 may be simultaneously formed on the first base substrate 101 including the color filter patterns 161 and 162 and the dummy color pattern 163 thereon.

A height of the black sub-column spacer 186a may be lower than the black column spacer 183, with respect to the first base substrate 101. A cross-sectional thickness of the black column spacer 183 may be substantially equal to or greater than a thickness of the black boundary pattern 186.

The sealant 190 may be disposed on the black boundary pattern 186 in the outer area NA. In an exemplary embodiment, for example, the sealant 190 may be disposed in the seal line area SLA of the peripheral area PA. A cross-sectional thickness of the sealant 190 may be substantially equal to or greater than that of the black column spacer 183.

The opposing substrate 200 may include a second base substrate 201. The opposing substrate 200 may further include a common electrode 210 on the second base substrate 201.

As mentioned above, according to the illustrated exemplary embodiment of the liquid crystal display panel, a portion of the black boundary pattern 186 in the outer area NA may have a cross-sectional thickness which is larger than that of a portion of the black boundary pattern 186 in the outer area DM, thereby reducing a height of the portion of the black boundary pattern 186 overlapping the dummy color pattern 163.

Also, a height of a portion of the black boundary pattern 186 in the dummy area DM may be lower than a height of the black column spacer 183 in the display area DA, with respect to the first base substrate 101, thereby maintaining a cell gap both in the display area DA and the peripheral area PA to improve yield rate and manufacturing reliability of the liquid crystal panel.

FIG. 4A to 4F are cross-sectional views illustrating an exemplary embodiment of a method of manufacturing the array substrate taken along line I-I' in FIG. 3.

Figure 4A:
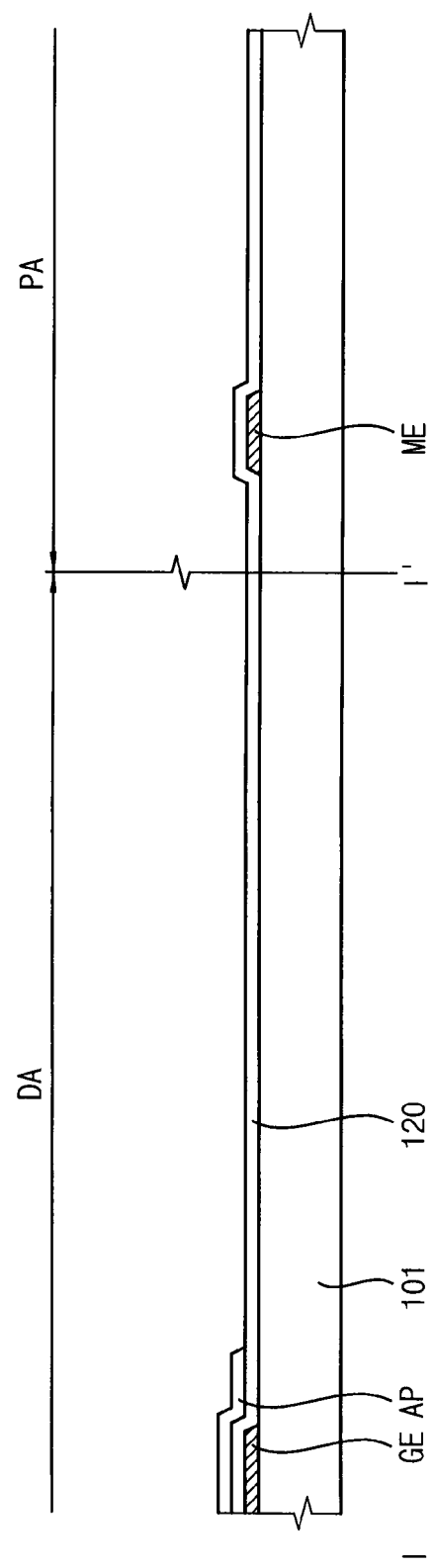

Referring to FIG. 2, FIG. 3 and FIG. 4A, a gate line GL, a gate electrode GE and a metal pattern ME may be formed on a first base substrate 101. The gate line GL and the gate electrode GE may be formed in a display area DA. The metal pattern ME may be formed in a peripheral area PA. In an exemplary embodiment, for example, a gate metal layer may be formed on the first base substrate 101. The gate metal layer may be patterned to form the gate line GL and the gate electrode GE in the display area DA and to form the metal pattern ME in the peripheral area.

A gate insulation layer 120 may be formed on the gate line GL, the gate electrode GE and the metal pattern ME. The gate insulation layer 120 may be entirely formed in the display area DA and the peripheral area PA.

An active pattern AP may be formed on the gate insulation layer 120. The active pattern AP may overlap the gate electrode GE.

Figure 4B:
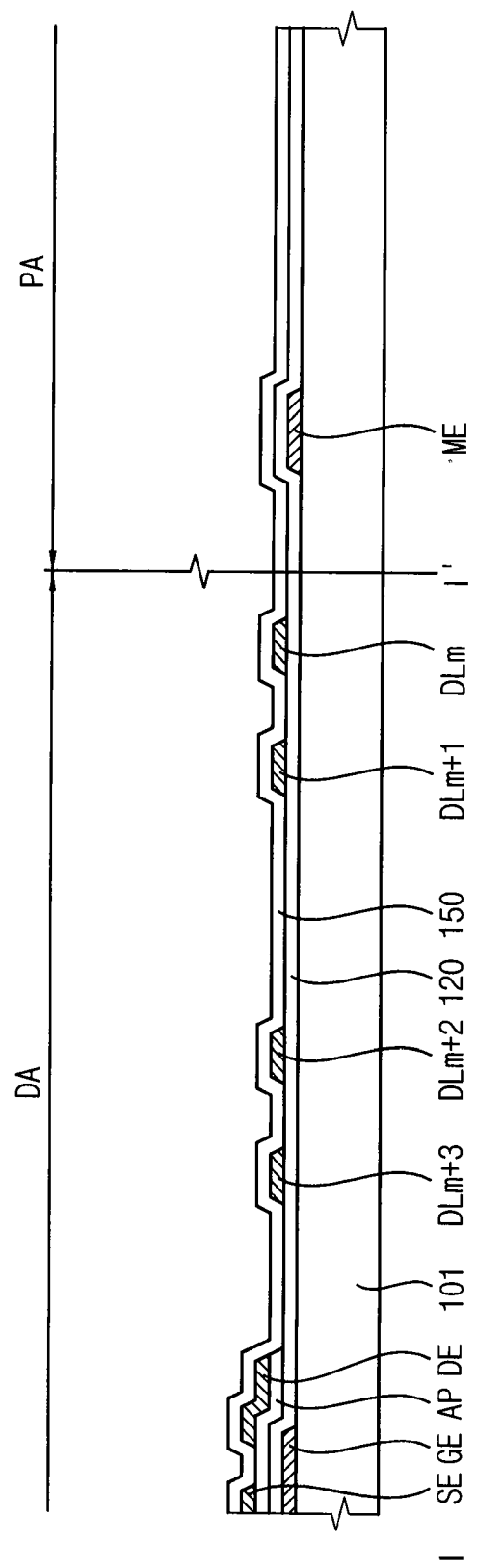

Referring to FIG. 2, FIG. 3 and FIG. 4B, a source electrode SE, a drain electrode DE and data lines DLm, DLm+1, DLm+2 and DLm+3 are formed on the first base substrate 101 including the active pattern AP thereon. In an exemplary embodiment, for example, a source metal layer may be formed on the first base substrate 101 including the active pattern AP thereon. The source metal layer may be patterned to form the source electrode SE, the drain electrode DE and the data lines DLm, DLm+1, DLm+2 and DLm+3 in the display area DA. The source electrode SE may overlap a first end portion of the active pattern AP. The drain electrode DE may be spaced apart from the source electrode SE. The drain electrode DE may overlap a second end portion of the active pattern AP opposite to the first end portion.

A passivation layer 150 may be formed on the source electrode SE, the drain electrode DE and the data lines DL. The passivation layer 150 may be entirely formed in the display area DA and the peripheral area PA.

Figure 4C:
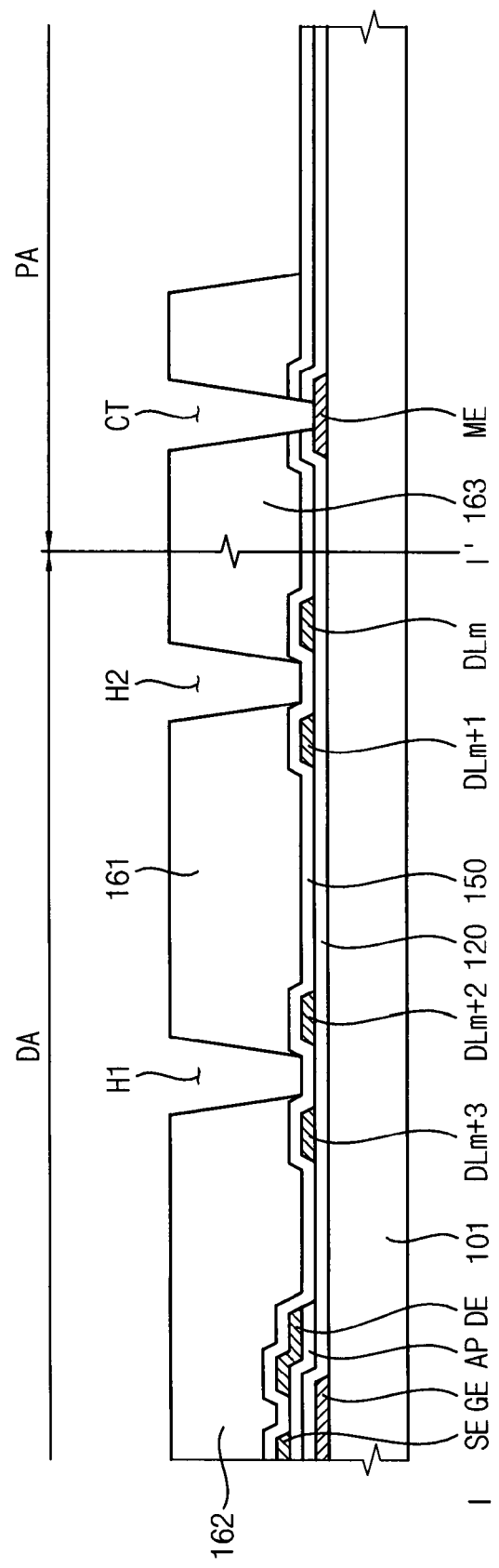

Referring to FIG. 2, FIG. 3 and FIG. 4C, color filter patterns 161 and 162 and a dummy color pattern 163 may be formed on the passivation layer 150. In an exemplary embodiment, for example, a first color filter 161 transmitting a first color light and a second color filter 162 transmitting a second color light different from the first color light may be formed in the display area DA. The dummy color pattern 163 may be formed in the peripheral area PA. The dummy color pattern 163 may transmit a color light same as or different from one of the first color light and the second color light. In an exemplary embodiment, for example, the first color filter 161 may overlap a first pixel area between an m+1-th data line DLm+1 and an m+2-th data line DLm+2. The second color filter 162 may overlap a second pixel area between an m+3-th data line DLm+3 and an m+4-th data line (not illustrated). A plurality of grooves H1 and H2 may be defined in and between the color filter patterns 161 and 162 in the display area DA. In an exemplary embodiment, for example, a first groove H1 may be defined between the first color filter 161 and the second color filter 162.

A contact hole CT partially exposing the metal pattern ME may be formed in the dummy color pattern 163 in the peripheral area PA.

Figure 4D:
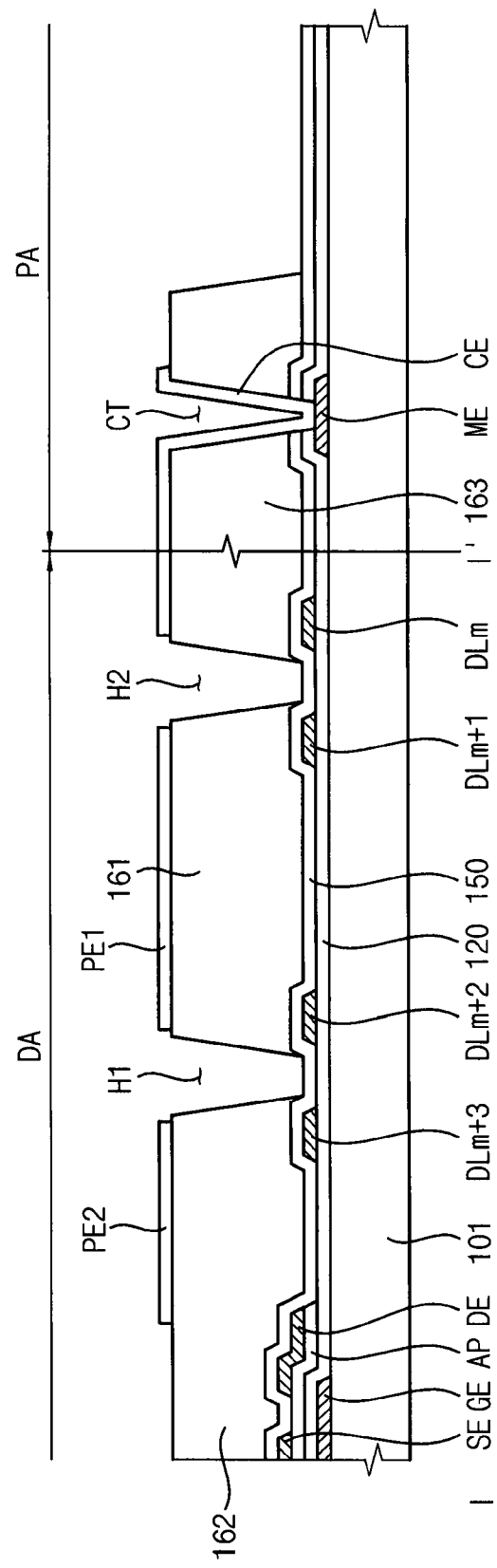

Referring to FIG. 2, FIG. 3 and FIG. 4D, pixel electrodes PE1 and PE2 may be formed on the first base substrate 101 including the color filter pattern 161 and 162 thereon. A contact electrode CE may be further formed on the first base substrate 101 including the dummy color pattern 163 thereon. In an exemplary embodiment, for example, a transparent conductive layer may be formed on the first base substrate 101 including the color filter patterns 161 and 162 and the dummy color pattern 163 thereon. The transparent conductive layer may be patterned to form a first pixel electrode PE1 in the first pixel area, a second pixel electrode PE2 in the second pixel area and a contact electrode CE in the peripheral area PA. The contact electrode CE may contact the metal pattern ME through the contact hole CT defined in the dummy color pattern 163.

Referring to FIG. 2, FIG. 3 and FIG. 4E, a light blocking layer 180 may be formed on the first base substrate 101 including the pixel electrodes PE1 and PE2 and the contact electrode CE thereon. The light blocking layer 180 may have a desired thickness corresponding to a cell gap of a liquid crystal display panel with respect to the color filter patterns 161 and 162.

A mask 500 may be provided on the first base substrate 101 including the light blocking layer 180 thereon. The mask 500 may include a light transmitting portion 510, a light blocking portion 530 and slit portions 520 and 525. In other exemplary embodiments, the mask 500 may include a transreflective portion instead of the slit portions 520 and 525.

The slit portions 520 and 525 may include a first slit portion 520 transmitting a first light amount and a second slit portion 525 transmitting a second light amount greater than the first light amount.

The light transmitting portion 510 may overlap a location on which a black column spacer 183 is to be formed in the display area DA. The light transmitting portion 510 may overlap an outer area NA in which the dummy color pattern 163 is not formed in the peripheral area PA.

The light blocking portion 530 may overlap the pixel area in which the pixel electrode PE is formed in the display area DA.

The first slit portion 520 may overlap a dummy area DM on which the dummy color pattern 163 is formed in the peripheral area PA.

The second slit portion 525 may overlap a location on which a black matrix pattern 181 is to be formed in the display area DA. In an exemplary embodiment, for example, the second slit portion 525 may overlap the grooves H1 and H2 between the color filter patterns 161 and 162. The second slit portion 525 may overlap a location on which a black sub-column spacer 186*a* is to be formed in the dummy area DM of the peripheral area PA.

The light blocking layer 180 may be selectively exposed to a light using the mask 500 to form the black column spacer 183 and the black matrix pattern 181 in the display area DA and the black sub-column spacer 186*a* and the black boundary pattern 186 in the peripheral area PA.

Figure 4F:
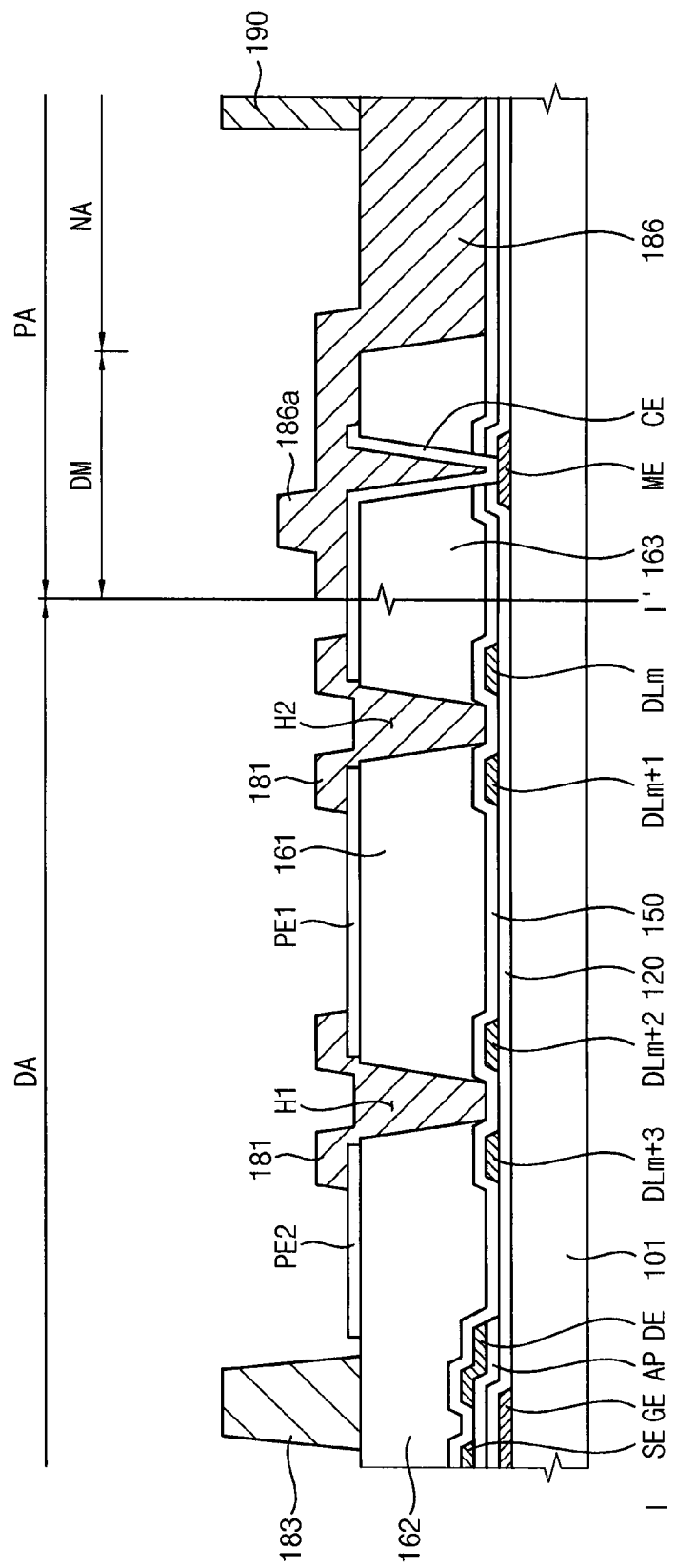

Referring to FIG. 2, FIG. 3 and FIG. 4F, a sealant 190 may be formed on the black boundary pattern 186 in the peripheral area PA. The sealant 190 may partially overlap the black boundary pattern 186 in the outer area NA.

As mentioned above, according to one or more exemplary embodiment of the method of manufacturing the array substrate 100, the black column spacer 183, the black matrix pattern 181 and the black boundary pattern 186 may be simultaneously formed in a single process such that the collective light blocking pattern is in a same layer and includes a same material, thereby simplifying the manufacturing process. Also, a cross-sectional thickness of the black boundary pattern 186 in the dummy area DM may be reduced, thereby maintaining a cell gap in the peripheral area PA to be substantially the same as that defined by a height of the black column spacer 183.

Also, the mask 500 having the first slit portion 520 may be used, thereby reducing a difference in heights of the black matrix pattern 181 and the color filter patterns 161 and 162. Also, the light blocking layer 180 may be exposed by different light amounts in the dummy area DM and the outer area NA of the peripheral area PA, thereby reducing a portion of the black boundary pattern 186 which overlaps the dummy color pattern 163.

Furthermore, the mask 500 having the first slit portion 520 and the second slit portion 525 transmitting different light amounts may both be used in the dummy area DM, thereby simultaneously forming the black sub-column spacer 186*a* and the black boundary pattern 186, and thereby reducing an increment of volume of the liquid crystal layer 300.

The foregoing is illustrative of exemplary embodiments and is not to be construed as limiting thereof Although a few exemplary embodiments have been described, those skilled in the art will readily appreciate that many modifications are possible in exemplary embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. An array substrate comprising:
    a base substrate comprising a display area, and a peripheral area adjacent to the display area;
    a gate line extending in a first direction, on the base substrate;
    a data line extending in a second direction crossing the gate line;
    a switching element electrically connected to the gate line and the data line;
    a color filter pattern and a dummy color pattern in the display area and the peripheral area, respectively;
    a metal pattern between the base substrate and the dummy color pattern, in the peripheral area;
    a pixel electrode on the color filter pattern and electrically connected to the switching element;
    a contact electrode disposed on the dummy color filter pattern and electrically connected to the metal pattern in the peripheral area; and
    a light blocking pattern comprising:
        a black matrix pattern partially overlapping the color filter pattern in the display area; and
        a black boundary pattern overlapping the dummy color pattern and covering the peripheral area, the black boundary pattern comprising a first portion which overlaps the dummy color pattern, and a second portion which does not overlap the dummy color pattern,
    wherein
        a cross-sectional thickness of the first portion of the black boundary pattern is smaller than that of the second portion of the black boundary pattern,
        the second portion which does not overlap the dummy color pattern is disposed in an edge area of the peripheral area, and
        a height of the dummy color pattern disposed in the peripheral area is the same as a height of the color filter pattern disposed in the display area, with respect to the base substrate.

2. The array substrate of claim 1, wherein the gate line, the data line, the switching element and the pixel electrode are in the display area.

3. The array substrate of claim 1, wherein the color filter pattern comprises:
    a first color filter which transmits a first color light; and
    a second color filter which transmits a second color light which is different from the first color light, further comprising a groove defined in the color filter pattern and between the first color filter and the second color filter.

4. The array substrate of claim 3, wherein the black matrix pattern is in the groove between the first color filter and the second color filter.

5. The array substrate of claim 1, wherein the light blocking pattern further comprises a black column spacer on the color filter pattern.

6. The array substrate of claim 5, wherein
the black boundary pattern further comprises a protruding portion extending from the first portion of the black boundary pattern, and
a height of the protruding portion is smaller than a height of the black column spacer, with respect to the base substrate.

7. The array substrate of claim 5, wherein the black column spacer, the black matrix pattern and the black boundary pattern comprise a same material as each other.

8. The array substrate of claim 1, wherein a height of the first portion of the black boundary pattern is greater than a height of the second portion of the black boundary pattern, with respect to the base substrate.

9. The array substrate of claim 1, further comprising a sealant on the second portion of the black boundary pattern.

10. A liquid crystal display panel comprising:
an array substrate comprising:
a base substrate comprising a display area, and a peripheral area adjacent to the display area;
a gate line extending in a first direction on the base substrate;
a data line extending in a second direction crossing the gate line;
a thin film transistor electrically connected to the gate line and the data line;
a color filter pattern and a dummy color pattern in the display area and the peripheral area, respectively;
a metal pattern between the base substrate and the dummy color pattern, in the peripheral area;
a pixel electrode on the color filter pattern and electrically connected to the thin film transistor;
a contact electrode disposed on the dummy color filter pattern and electrically connected to the metal pattern in the peripheral area; and
a light blocking pattern comprising:
a black matrix pattern partially overlapping the color filter pattern in the display area; and
a black boundary pattern overlapping the dummy color pattern and covering the peripheral area, the black boundary pattern comprising a first portion which overlaps the dummy color pattern, and a second portion which does not overlap the dummy color pattern;
an opposing substrate facing the array substrate; and
a liquid crystal layer between the array substrate and the opposing substrate,
wherein
a cross-sectional thickness of the first portion of the black boundary pattern is smaller than that of the second portion of the black boundary pattern,
the second portion which does not overlap the dummy color pattern is disposed in an edge area of the peripheral area, and
a height of the dummy color pattern disposed in the peripheral area is the same as a height of the color filter pattern disposed in the display area, with respect to the base substrate.

11. The liquid crystal display panel of claim 10, wherein the color filter pattern comprises:
a first color filter which transmits a first color light, and
a second color filter which transmits a second color light different from the first color light,
further comprising a groove defined in the color filter pattern and between the first color filter and the second color filter,
wherein the black matrix pattern is in the groove.

12. The liquid crystal display panel of claim 10, wherein the light blocking pattern further comprises a black column spacer on the color filter pattern.

13. The liquid crystal display panel of claim 12, wherein
the black boundary pattern further comprises a protruding portion extending from the first portion of the black boundary pattern, and
a height of the protruding portion is smaller than a height of the black column spacer, with respect to the base substrate.

14. The liquid crystal display panel of claim 12, wherein the black column spacer, the black matrix pattern and the black boundary pattern comprise a same material as each other.

15. A method of manufacturing an array substrate comprising:
forming a metal pattern and a passivation layer on a base substrate, the passivation layer covering the metal pattern, the base substrate comprising a display area and a peripheral area which is adjacent to the display area;
forming a color filter pattern in the display area and a dummy color pattern in the peripheral area, on the passivation layer;
forming a pixel electrode and a contact electrode on the color filter pattern and the dummy color pattern, respectively;
forming a light blocking layer entirely covering the base substrate comprising the pixel electrode thereon; and
patterning the light blocking layer using a mask to form a light blocking pattern comprising a black boundary pattern, the black boundary pattern covering the dummy color pattern,
wherein
a cross-sectional thickness of a first portion of the black boundary pattern overlapping the dummy color pattern is smaller than that of a second portion of the black boundary pattern not overlapping the dummy color pattern,
the second portion which does not overlap the dummy color pattern is disposed in an edge area of the peripheral area, and
a height of the dummy color pattern disposed in the peripheral area is the same as a height of the color filter pattern disposed in the display area, with respect to the base substrate.

16. The method of claim 15, wherein the mask has a slit portion overlapping the first portion of the black boundary pattern and a transmitting portion overlapping the second portion of the black boundary pattern.

17. The method of claim 15, further comprising:
patterning the light blocking layer to further form a black matrix pattern of the light blocking pattern, partially overlapping the color filter pattern,
wherein the black boundary pattern and the black matrix pattern of the light blocking pattern are simultaneously formed.

18. The method of claim 15, wherein the mask comprises:
a first slit portion overlapping the first portion of the black boundary pattern and configured to transmit a first light amount;
a second slit portion overlapping the first portion of the black boundary pattern and configured to transmit a second light amount greater than the first light amount; and
a light transmitting portion overlapping the second portion of the black boundary pattern,
wherein the forming the black boundary pattern comprises patterning the light blocking layer to further form a protruding portion of the black boundary pattern extending from the first portion of the black boundary pattern.

19. The method of claim 15, further comprising forming a sealant partially overlapping the second portion of the black boundary pattern.

* * * * *